United States Patent
Hayes

(10) Patent No.: US 9,753,124 B2
(45) Date of Patent: Sep. 5, 2017

(54) LIDAR POINT CLOUD COMPRESSION

(75) Inventor: John Hayes, Seattle, WA (US)

(73) Assignee: Celartem, Inc., Portland, OR (US)

( * ) Notice: Subject to any disclaimer, the term of this patent is extended or adjusted under 35 U.S.C. 154(b) by 1283 days.

(21) Appl. No.: 12/819,931

(22) Filed: Jun. 21, 2010

(65) Prior Publication Data

US 2011/0010400 A1    Jan. 13, 2011

Related U.S. Application Data

(60) Provisional application No. 61/225,141, filed on Jul. 13, 2009.

(51) Int. Cl.
| | |
|---|---|
| *G01S 17/00* | (2006.01) |
| *G01S 7/48* | (2006.01) |
| *H03M 7/30* | (2006.01) |
| *G06T 9/00* | (2006.01) |
| *H04N 19/64* | (2014.01) |
| *H04N 19/436* | (2014.01) |
| *G01S 17/89* | (2006.01) |

(52) U.S. Cl.
CPC ............... *G01S 7/48* (2013.01); *G06T 9/007* (2013.01); *H03M 7/30* (2013.01); *H03M 7/3059* (2013.01); *H04N 19/436* (2014.11); *H04N 19/647* (2014.11); *G01S 17/89* (2013.01)

(58) Field of Classification Search
None
See application file for complete search history.

(56) References Cited

U.S. PATENT DOCUMENTS

| | | | |
|---|---|---|---|
| 2004/0217956 A1 | 11/2004 | Besl | |
| 2005/0203930 A1* | 9/2005 | Bukowski et al. | 707/100 |
| 2009/0027412 A1* | 1/2009 | Burley et al. | 345/582 |
| 2009/0287459 A1* | 11/2009 | Chang et al. | 703/1 |
| 2010/0138745 A1* | 6/2010 | McNamara et al. | 715/720 |
| 2010/0239178 A1* | 9/2010 | Osher et al. | 382/243 |
| 2010/0328308 A1* | 12/2010 | Gamliel et al. | 345/420 |
| 2011/0010400 A1 | 1/2011 | Hayes | |

FOREIGN PATENT DOCUMENTS

| | | |
|---|---|---|
| EP | 2454660 A2 | 5/2012 |
| KR | 2003043637 A | 6/2003 |
| WO | 2011/008579 A2 | 1/2011 |

OTHER PUBLICATIONS

Bajaj, C., et al., "3D RGB Image Compression for Interactive Applications," Journal of ACM Transactions on Graphics 20(1), Jan. 2001, 33 pages.

(Continued)

*Primary Examiner* — Mohammad S Rostami
(74) *Attorney, Agent, or Firm* — Christensen O'Connor Johnson Kindness PLLC

(57) ABSTRACT

Using LIDAR technology, terabytes of data are generated which form massive point clouds. Such rich data is a blessing for signal processing and analysis but also is a blight, making computation, transmission, and storage prohibitive. The disclosed subject matter includes a technique to convert a point cloud into a form that is susceptible to wavelet transformation permitting compression that is nearly lossless.

15 Claims, 12 Drawing Sheets

(56) References Cited

OTHER PUBLICATIONS

Gumhold, S., et al., "Predictive Point-Cloud Compression," ACM SIGGRAPH Sketches, SIGGRAPH 2005, Jul. 31-Aug. 4, 2005, Los Angeles, 1 page.
Schnabel, R., and R. Klein, "Octree-Based Point-Cloud Compression," in M. Botsch and B. Chen (eds.) Proceedings of the IEEE/Eurographics Symposium on Point-Based Graphics, Boston, Jul. 29-30, 2006, pp. 111-120.
Secker, A., and D. Taubman, "Motion-Compensated Highly Scalable Video Compression Using an Adaptive 3D Wavelet Transform Based on Lifting," Proceedings of the 2001 International Conference on Image Processing, vol. 2, Thessaloniki, Greece, Oct. 7-10, 2001, pp. 1029-1032.
International Search Report mailed Feb. 25, 2011, issued in corresponding PCT/US2010/040782, filed Jul. 1, 2010, 5 pages.
Daubechies, I., et al., "Wavelets on Irregular Point Sets," Philosophical Transactions of the Royal Society of London, 1999, pp. 1-16.
Eck, M., et al., "Multiresolution Analysis fo Arbitrary Meshes," SIGGRAPH '95: Proceedings of the 22nd Annual Conference on Computer Graphics and Interactive Techniques, Los Angeles, Aug. 6-11, 1995, pp. 173-182.
Gerlek, M.P., "Compressing Lidar Data," Photogrammetric Engineering & Remote Sensing 75(11):1253-1255, Nov. 2009.
Hoppe, H., "Mesh Optimization," SIGGRAPH '93: Proceedings of the 20th Annual Conference on Computer Graphics and Interactive Techniques, Anaheim, California, Aug. 2-6, 1993, pp. 19-26.
Hoppe, H., "Progressive Meshes," SIGGRAPH '96: Proceedings of the 23rd Annual Conference on Computer Graphics and Interactive Techniques, New Orleans, Aug. 4-9, 1996, pp. 99-108.
Isenburg, M., and J. Snoeyink, "Mesh Collapse Compression," Technical Report TR-99-10, University of British Columbia, Vancouver, Canada, Nov. 1999, pp. 1-10.
Touma, C., and C. Gotsman, "Triangle Mesh Compression," Proceedings of Graphics Interface, Vancouver, Canada, Jun. 1998, 9 pages.
Wiman, H., and Y. Qin, "Fast Compression and Access of LiDAR Point Clouds Using Wavelets," 2009 Urban Remote Sensing Joint Event, Shanghai, May 20-22, 2009, 6 pages.
International Search Report mailed Dec. 9, 2010, issued in PCT/US2010/026555, filed Mar. 8, 2010, 3 pages.
Extended European Search Report dated Jun. 25, 2013, issued in corresponding European Application No. 10800315.3, filed Jul. 1, 2010, 5 pages.
Canadian Office Action dated Jun. 28, 2017, for Canadian Patent Application No. 2,767,712, filed Jul. 1, 2010, 3 pages.

\* cited by examiner

LIDAR POINT CLOUD COMPRESSION

CROSS-REFERENCE TO RELATED APPLICATION

The application claims the benefit of Provisional Application No. 61/225,141, filed Jul. 13, 2009, which is incorporated herein by reference.

BACKGROUND

A high-density elevation point cloud is desired for many topographic mapping applications. LIDAR is one of a few technologies available today that can produce such a point cloud. A point cloud is a set of vertices in a multiple-dimensional coordinate system. These vertices are usually defined at least by x, y, and z coordinates, and can be numbered in the billions. Having this much data to work with is a blessing, but also turns out to be a blight that frustrates computational, transmissive, and storage plans for these topographic mapping applications.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

One aspect of the present subject matter includes a system for compressing a point cloud. The system comprises a time series converter configured to receive vectors of the point cloud, and further configured to sort the vectors of the point cloud in accordance with ordinal references that are indicative of the order in which the data of the vectors were collected. The system further comprises a pipelined wavelet transformer comprising multiple pipeline stages all configured to receive results of the time series converter to produce coefficients that facilitate compression to produce a compressed point cloud.

Another aspect of the present subject matter includes a method for compressing a point cloud. The method comprises converting vectors of the point cloud in a computer in accordance with ordinal references that are indicative of the order in which the data of the vectors were collected. The method further comprises compressing using wavelet transformation in multiple pipeline stages all configured to receive results of the act of converting to produce coefficients that facilitate compression to produce a compressed point cloud.

A further aspect of the present subject matter includes a computer-readable medium having computer-executable instructions stored thereon for implementing a method for compressing a point cloud. The method comprises converting vectors of the point cloud in a computer in accordance with ordinal references that are indicative of the order in which the data of the vectors were collected. The method further comprises compressing using wavelet transformation in multiple pipeline stages all configured to receive results of the act of converting to produce coefficients that facilitate compression to produce a compressed point cloud.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Figure 1:
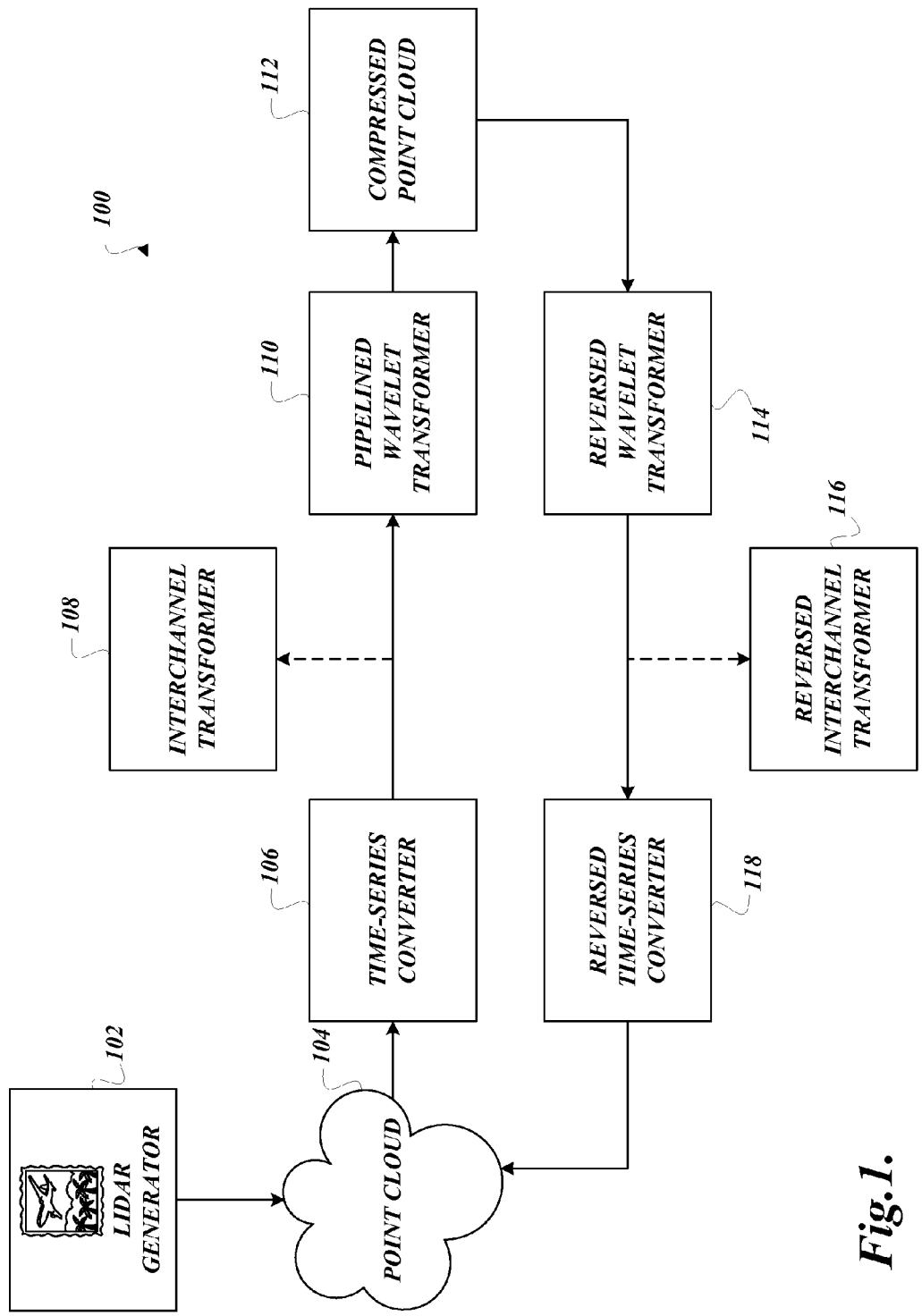
FIG. 1 is a block diagram illustrating exemplary hardware components to compress and decompress a point cloud in accordance with one embodiment of the present subject matter.
Figure 2A:
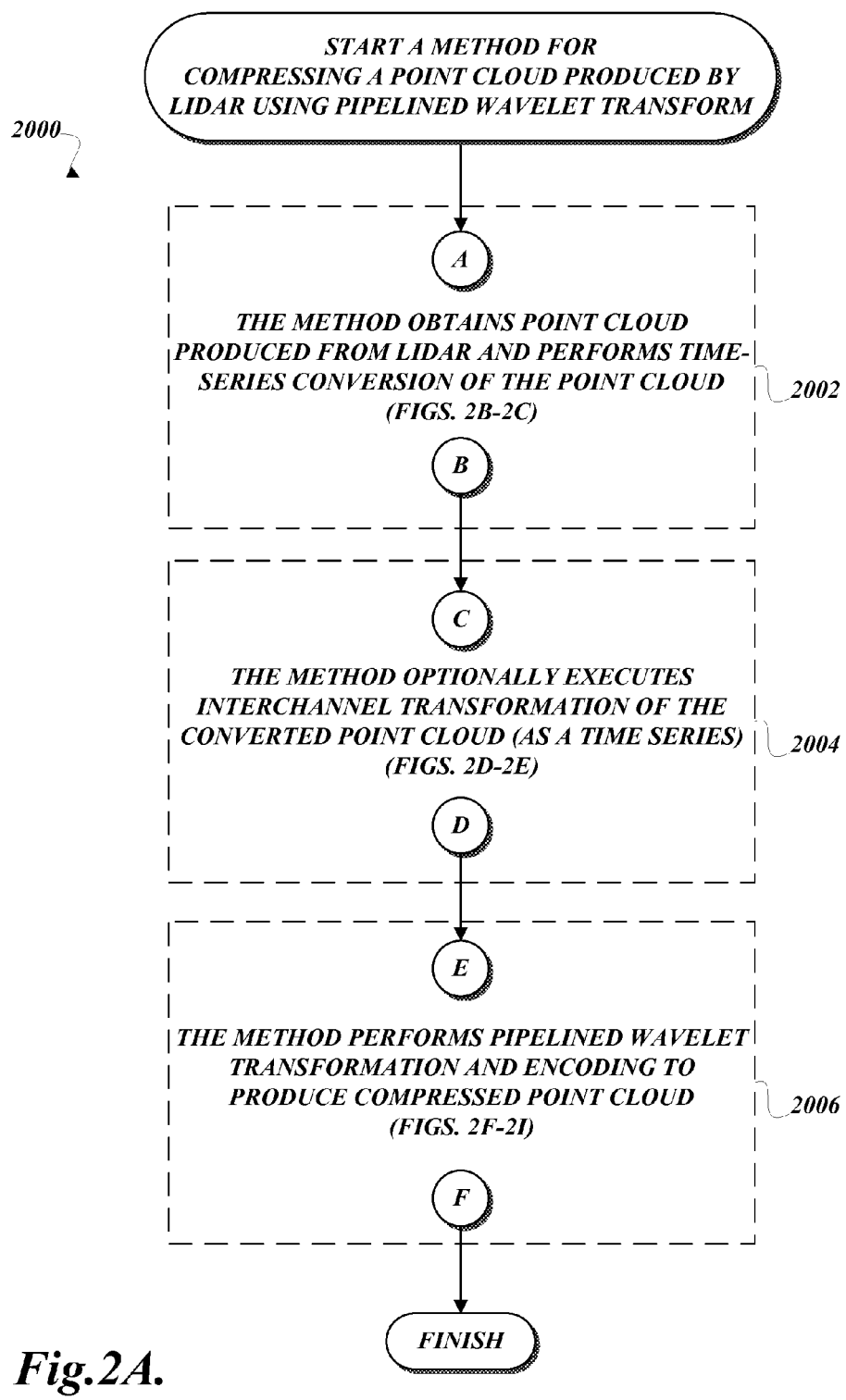
FIGS. 2A-2I are process diagrams illustrating a method for compressing a point cloud in accordance with one embodiment of the present subject matter.
Figure 2B:
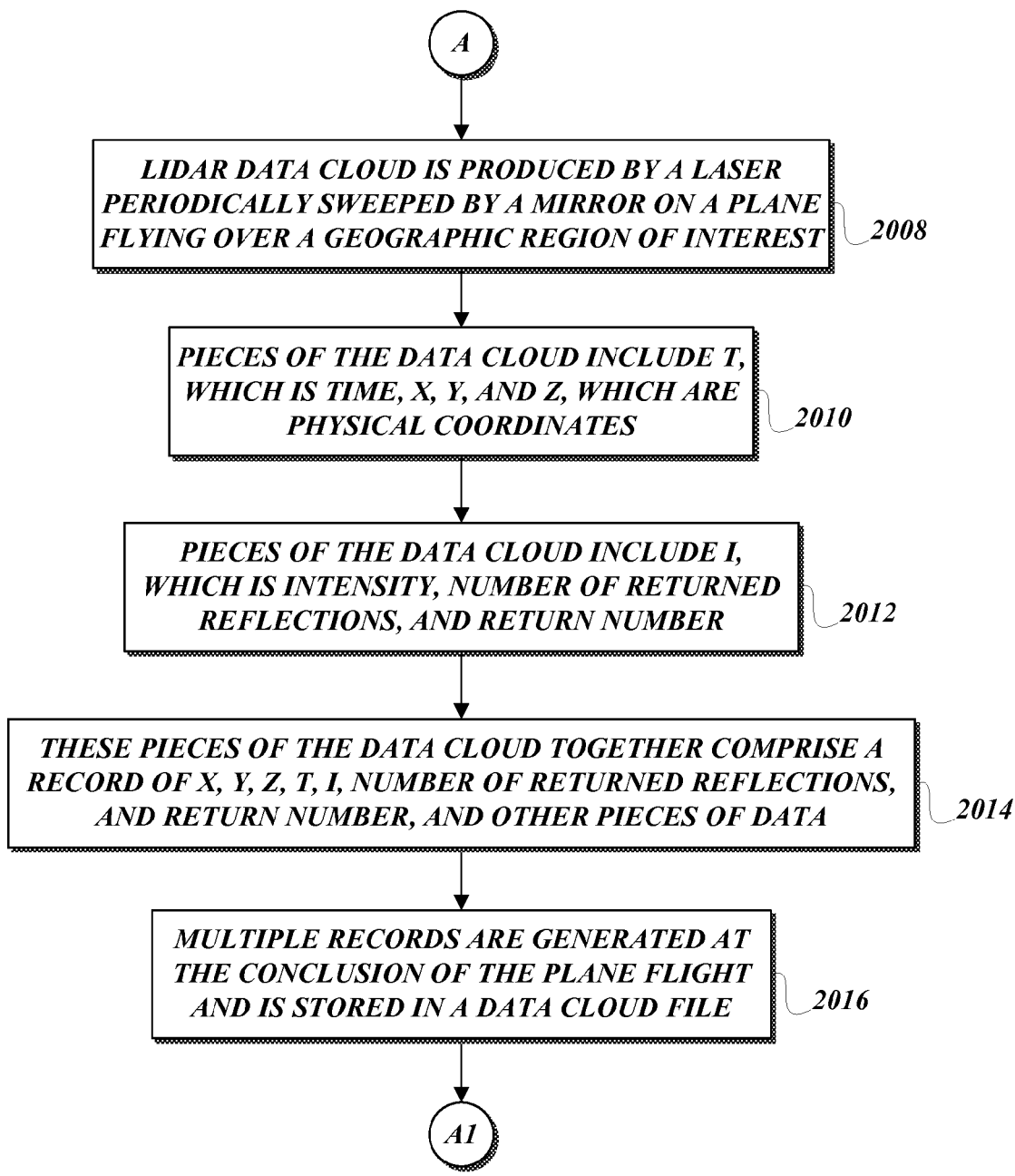
Figure 2C:
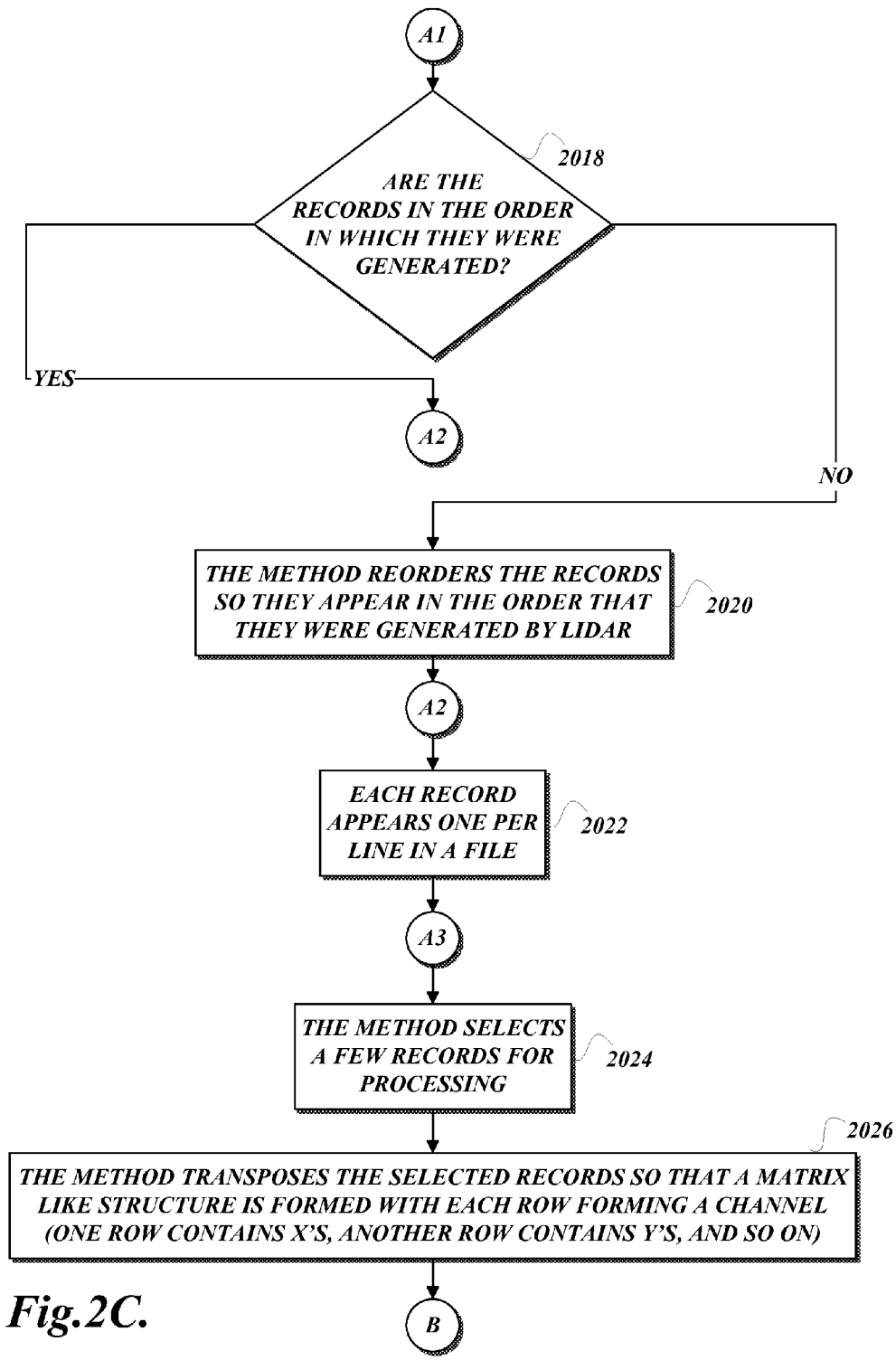
Figure 2D:
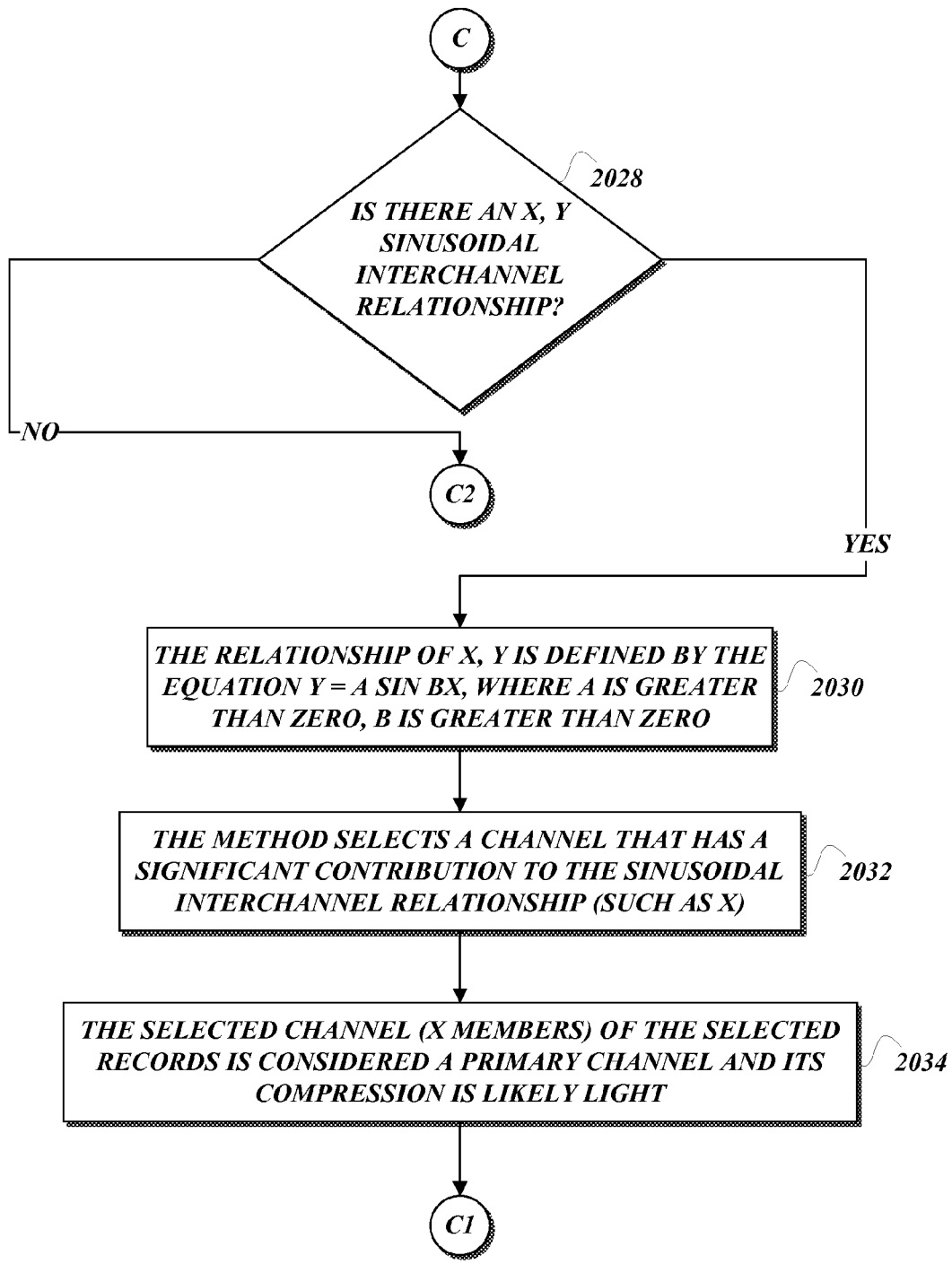
Figure 2E:
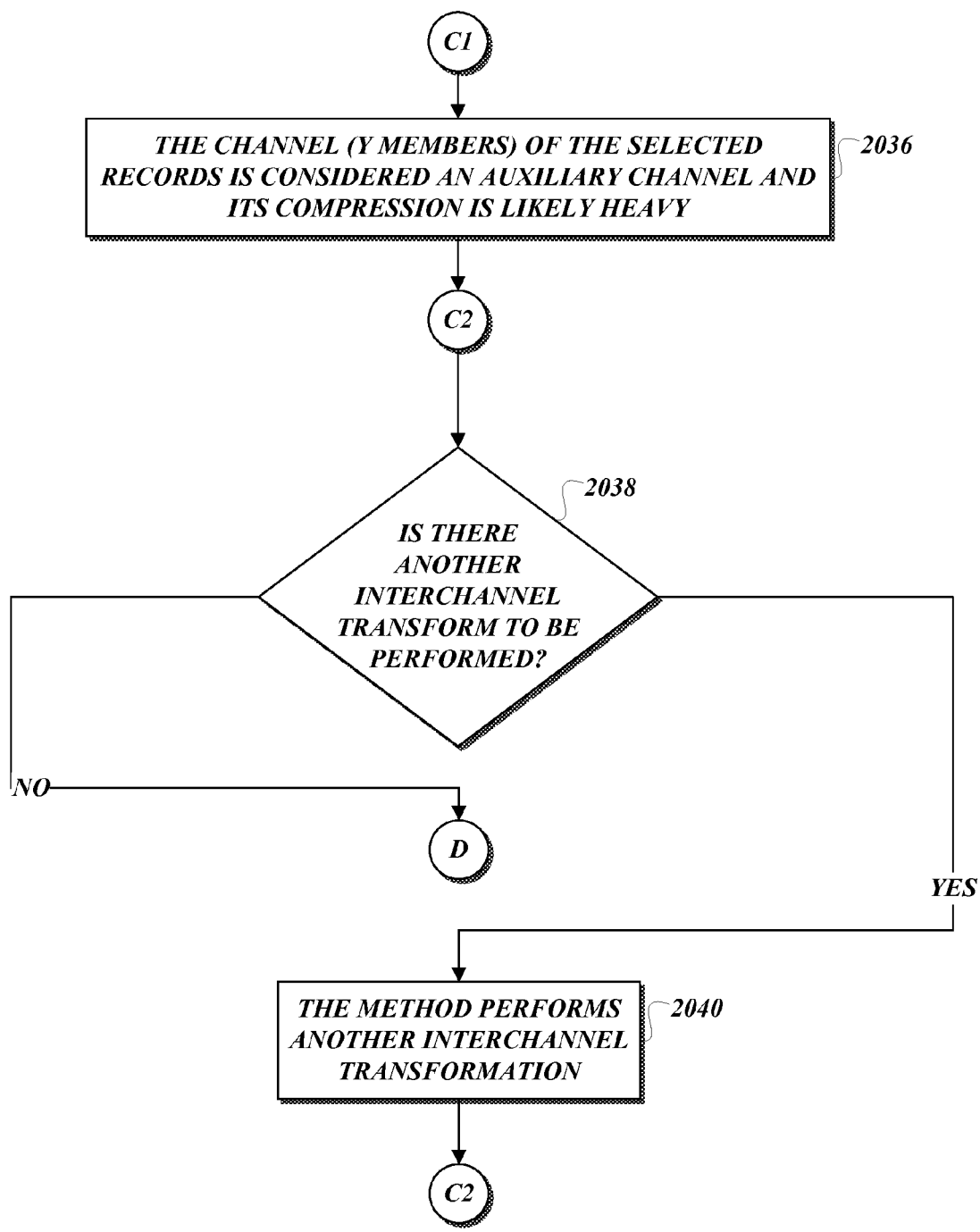
Figure 2F:
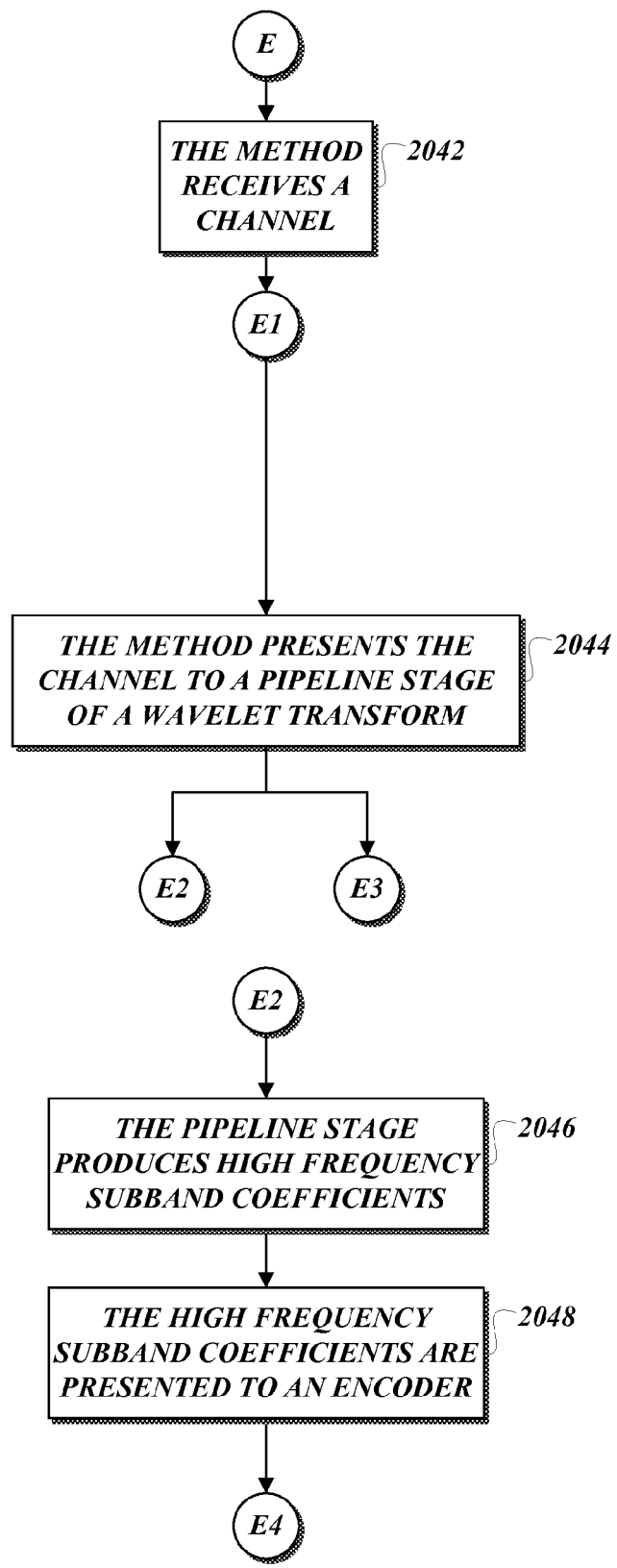
Figure 2G:
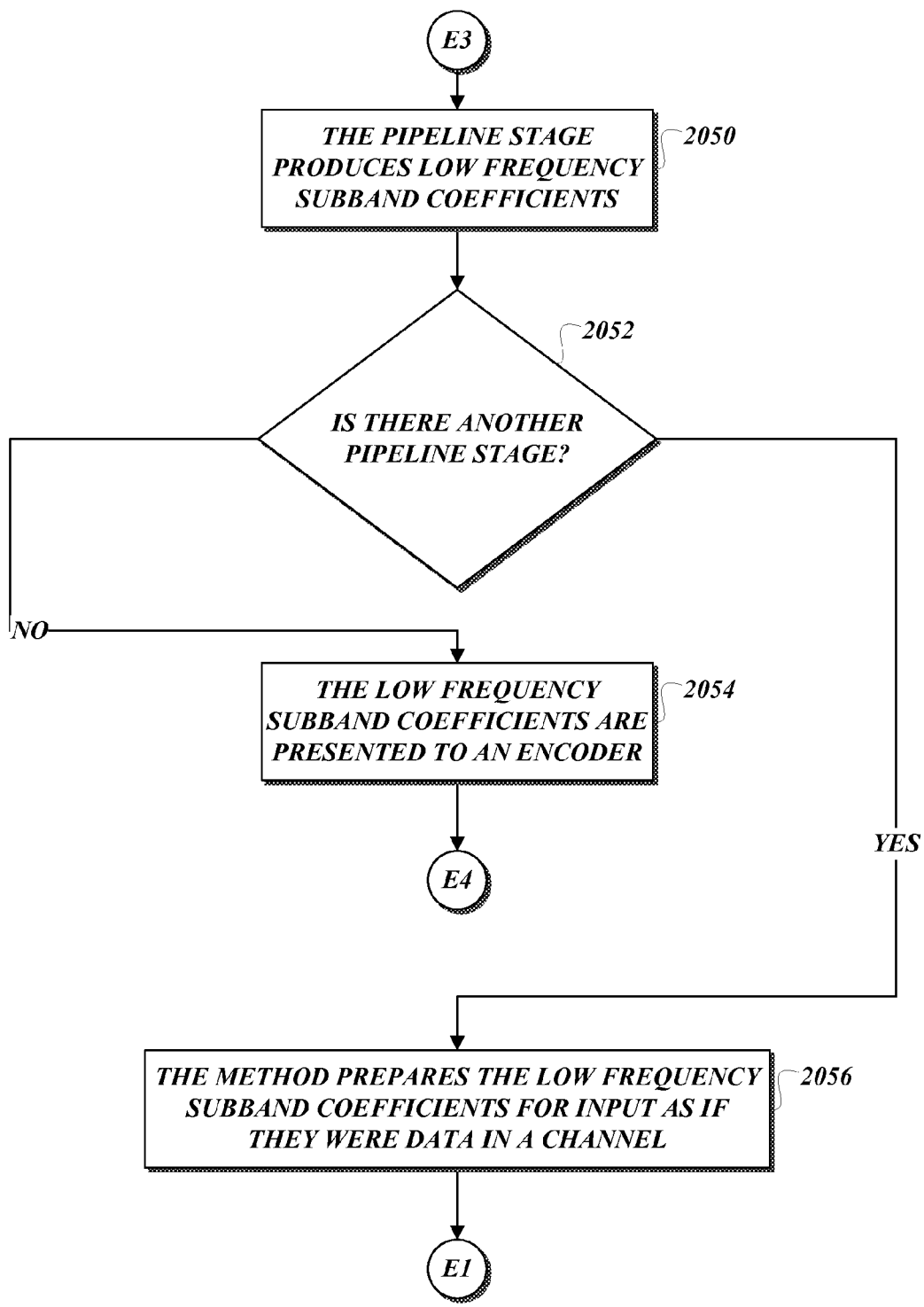
Figure 2H:
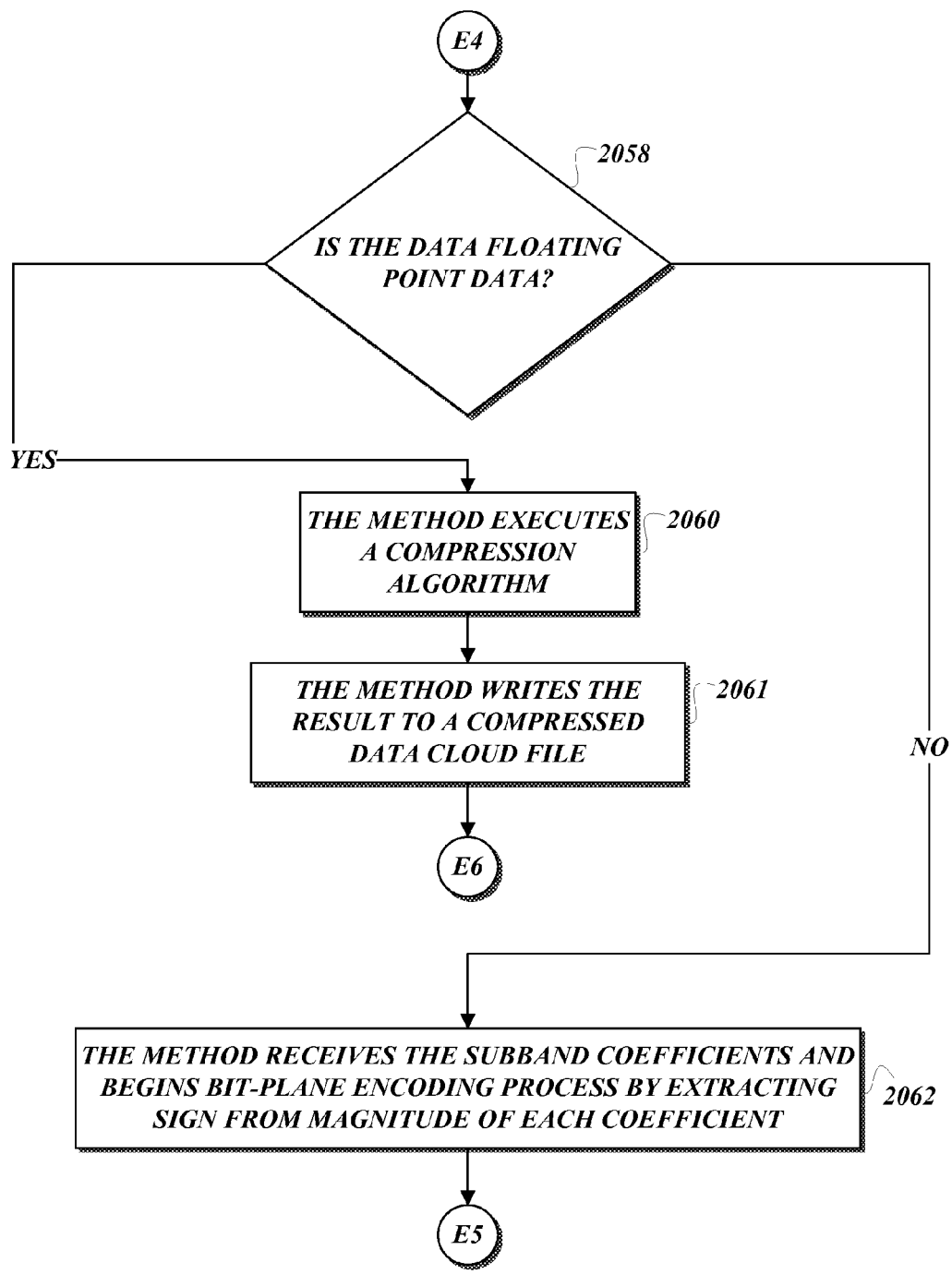
Figure 2I:
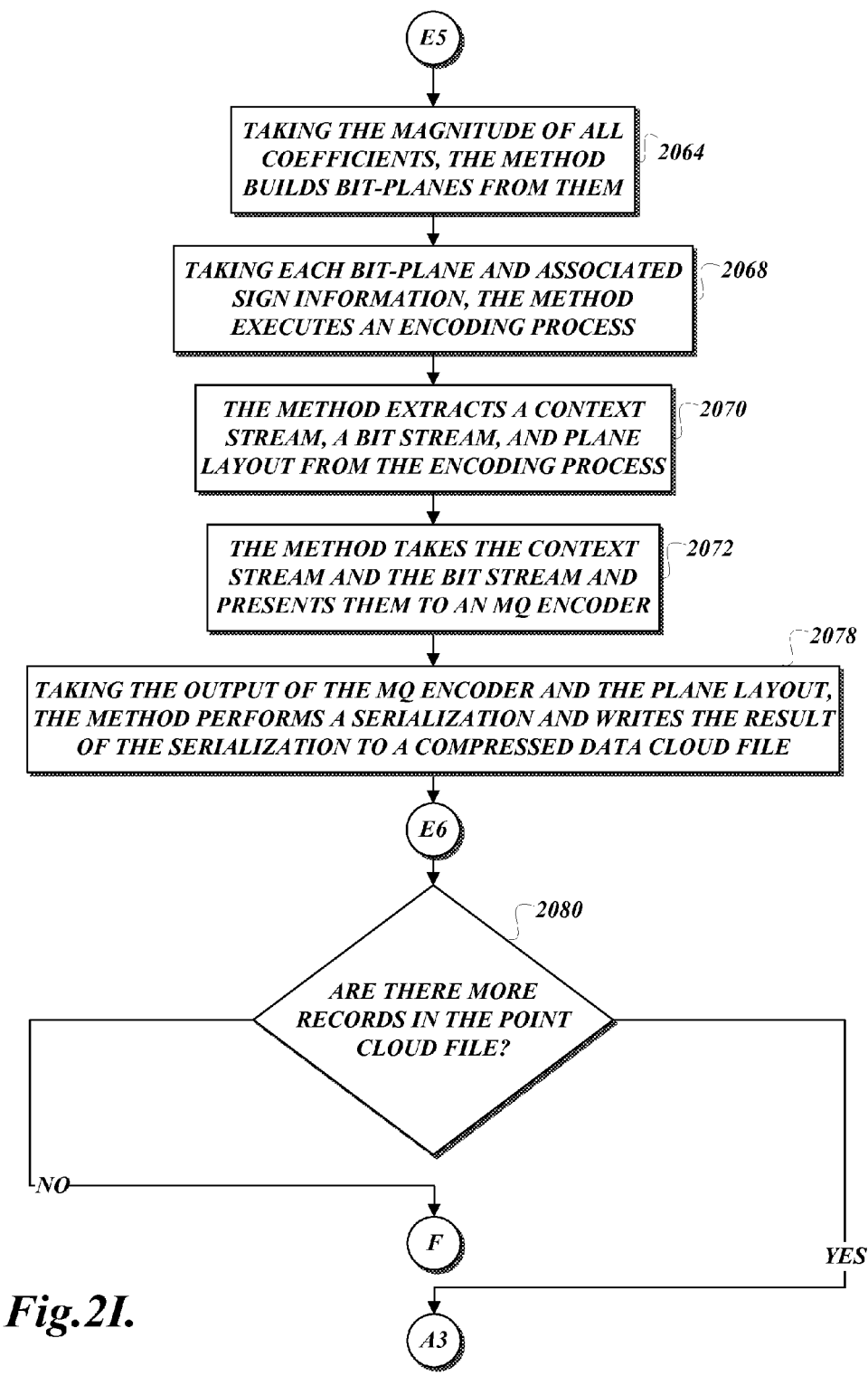

FIG. 1 illustrates a system 100 configured to compress and/or decompress a point cloud 104 produced by a lidar generator 102. Components of the system 100 include hardware components, such as one or more computers, standing alone or networked, on which one or more pieces of software execute. The etymology of LIDAR (hereinafter referred to as "lidar") traces its development to "light detection and ranging," which is an optical remote sensing technology that measures properties of scattered light to find range and/or other information of distant targets. The conventional method to sense distant targets is to use laser pulses. Unlike radar technology, which uses radio waves, consisting of light that is not in the visible spectrum, lidar's point cloud 104 is accumulated by the transmission of laser pulses and the detection of the reflected signals.

The lidar generator 102 comprises a laser placed on an aircraft that points toward a geographic region of interest. Incident laser pulses are directed toward the geographic region of interest while the aircraft undulatory moves in a wavy, sinuous, or flowing manner. The incident laser pulses eventually strike targets in the geographic region, causing reflected signals to return immediately if they strike sufficiently opaque targets, such as a rock, and a bit later if they strike sufficiently transparent targets, such as leaves on a tree. Thus, for one incident laser pulse, there may one or more reflected signals that are sensed by the aircraft. The reflected signal that returns first may have an intensity stronger than those reflected signals that return later.

In addition, a mirror toward which the laser points sweeps back and forth, causing the laser to send incident laser pulses that correspondingly sweep back and forth as the aircraft flies above the geographic region of interest. A tuple is formed from several dimensions to contribute to the point cloud 104, such as an ordinal reference that is indicative of the order in which the data of a vector was collected, locations (x, y, and z), time, intensity, the number of reflected signals that return, the numerical reference of a particular reflected signal that returns, and so on. Many other suitable dimensions are possible in addition to those mentioned here. Millions or even billions of tuples may be formed as the aircraft travels above the geographic region of interest. This multitude of tuples creates a point cloud that is very large, making computation, transmission, and storage difficult.

The point cloud 104 is presented to a time series converter 106. The time series converter 106 creates a time series from the point cloud 104 by forming a sequence of vectors (the fields of the vector include the dimensions of the point cloud 104), measured at successive times, spaced at (relatively uniform) time intervals. The time series conversion suitably aids a pipelined wavelet transformer 110 primarily in wavelet analysis, leading to better compression of the point cloud 104.

The pipelined wavelet transformer 110 uses a set of wavelets to perform signal processing. Each wavelet mathematically appears as a wave-like oscillation with an amplitude that starts at zero, swells, and then dies away, causing a resonance if a small periodic stimulus provided by the vectors of the point cloud 104 contains information of similar frequency. The resonance is used to extract information from the vectors for subsequent compression. A set of reversed wavelets, used in a reversed wavelet transformer 114, may deconstruct compressed data without gaps or overlap so that the deconstruction process is mathematically reversible. Thus, the original point cloud 104 may be recovered after compression with the original information at minimal or no loss.

One benefit is that a wavelet produces information that can be used to immediately provide different samplings of the point cloud. A wavelet divides a given function (vector input representing a portion of the point cloud 104) into different scale components. Users of the system 100 may specify a frequency range to each scale component to obtain a desired resolution level. A wavelet transform, performed by the pipelined wavelet transformer 110, is the representation of a function by wavelets. Suitably, the pipelined wavelet transformer 110 performs discrete wavelet transformation. Subsequently, the transformation is compressed using bit planes and a suitable arithmetic coder. The result is outputted to a compressed point cloud file 112.

Using the different scale components afforded by the wavelet transformation, different scales of the point cloud 104 are provided. Suitably, one is at full scale, another is at half scale, yet another is at quarter scale. Each is progressively smaller. The number of samples at each scale is less than the number of samples of the original scale from which the lesser scale is derived. Suitably, the discrete wavelet transformation is executed using a lifting scheme. Assume that a pair of filters (h, g) is complementary in that together they allow for perfect reconstruction of data. For every filter (s) the pair (h', g) has a relationship $h'(z)=h(z)+s(z^2) \cdot g(z)$, and complementarily, every pair (h, g') has a form $g'(z)=g(z)+t(z^2) \cdot h(z)$. Conversely, if the filters (h, g) and (h', g) allow for perfect reconstruction, then there is a filter (s) defined by $h'(z)=h(z)+s(z^2) \cdot g(z)$.

An interchannel transformer 108 can optionally be executed to determine an interrelationship between a channel and another channel, and uses the interrelationship to transform the data of the channels before submission to the pipelined wavelet transformer 110. For example, data resulting from the mirror that sweeps the laser back and forth periodically may graph as a waveform representing periodic oscillations in which the amplitude of displacement is proportional to the trigonometric properties of the displacement. The channels x, y may have an interrelationship defined by the equation $$y = a \sin bx$$

Another interrelationship may exist with more than two channels, such as channels t, x, and y. In such a case, the interrelationship may be defined by the equations $$x = a \sin bt + c$$

$$y = d \sin et + f$$

With this knowledge, the system 100 may collapse primary information into one channel prior to wavelet transformation while auxiliary information is placed into another channel. During compression, a specification is made where primary information undergoes light compression whereas auxiliary information undergoes heavier compression.

The reversed wavelet transformer 114 receives the compressed point cloud file 112 and prepares for decompression. Structurally, the reversed wavelet transformer 114 is similar to the pipelined wavelet transformer 110, except that compressed data is flowing into the pipeline in parallel. High frequency coefficients from the compressed point cloud file 112 are presented to decoders and from the decoders to pipeline stages at the end of which the original channels are reconstituted. If interchannel transformation was performed by the interchannel transformer 108, a reversed interchannel transformer 116 is activated here to further process the reconstituted channels to obtain original channels of the point cloud 104. A reversed time-series converter 118 is performed to revert the data back to its original order in the point cloud 104.

FIGS. 2A-2I illustrate a method 2000 for compressing a point cloud produced by lidar technology using a pipelined wavelet transform. From a start block, the method 2000 proceeds to a set of method steps 2002, defined between a continuation terminal ("terminal A") and an exit terminal ("terminal B"). The set of method steps 2002 describes the execution of a set of steps to obtain the point cloud and converting the point cloud to a time series. See FIGS. 2B, 2C.

From terminal A (FIG. 2B), the method 2000 proceeds to block 2008 where a lidar point cloud is produced by a laser periodically sweeping by a mirror on an aircraft flying over a geographic region of interest. At block 2010, the pieces of the point cloud include t, which is time, and x, y, and z, which are physical coordinates. The method then proceeds to block 2012 where further pieces of data, including intensity, which is I, number of returned signals, and a return number reference associated with a returned signal. At block 2014, these pieces of the point cloud together comprise a record of x, y, z, t, i, number of returned signals, and return number, as well as other pieces of data, such as ordinance reference which indicates an order in which a vector or record containing these pieces of data was generated. These multiple records are stored in a point cloud file. See block 2016. The method then continues to another continuation terminal ("terminal A1").

From terminal A1 (FIG. 2C), the method continues to decision block 2018 where a test is performed to determine whether the records are in the ordinal sequence in which they were generated. See block 2018. If the answer to the test at decision block 2018 is Yes, the method continues to another continuation terminal ("terminal A2"). If the answer to the test at decision block 2018 is No, the method continues to block 2020 where the method sorts the records in accordance with the ordinal sequence in which the records were generated by lidar. The method then enters continuation terminal A2 (FIG. 2C) and further progresses to block 2022 where each record appears one per line in a file. The method then progresses to another continuation terminal ("terminal A3") and enters block 2024 where the method selects a few records for processing. At block 2026, the method transposes the selected records so that a matrix-like structure is formed with each row forming a channel (one row contains x's, another row contains y's, and so on). The method then progresses to terminal B.

From terminal B (FIG. 2A), the method proceeds to a set of method steps 2004, defined between a continuation terminal ("terminal C") and an exit terminal ("terminal D").

The set of method steps 2004 describes the optional execution of an interchannel transformation of a time series conversion of the point cloud. See FIGS. 2D, 2E. From terminal C (FIG. 2D), the method proceeds to decision block 2028 where a test is performed to determine whether there is an x, y sinusoidal interchannel relationship. If the answer is No to the test at decision block 2028, the method continues to block 2030 where the relationship of x, y is defined by the equation y=a sin bx, where a is greater than zero, b is greater than zero. At block 2032, the method selects a channel that has a significant contribution to the sinusoidal interchannel relationship, such as x. The selected channel (of which x is a member) of the selected records is considered a primary channel and its compression is likely light. The method then continues to another continuation terminal ("terminal C1").

From terminal C1 (FIG. 2E), the method proceeds to block 2036 where the channel (y members) of the selected records is considered an auxiliary channel, and its compression is likely heavy. The method then enters continuation terminal C2 and proceeds to decision block 2038 where a test is performed to determine whether there is another interchannel transformation to be performed. If the answer to the test at decision block 2038 is No, the method continues to exit terminal D. Otherwise, if the answer to the test at decision block 238 is Yes, the method proceeds to block 2040 where the method performs another interchannel transformation. (For example, an interrelationship may be defined among three channels t, x, and y, as discussed above, but there can be others.) The method then continues to terminal C2 and skips back to decision block 2038 where the above identified processing steps are repeated.

From terminal D (FIG. 2A), the method proceeds to a set of method steps 2006, defined between a continuation terminal ("terminal E") and an exit terminal ("terminal F"). The set of method steps 2006 describes the act of performing pipelined wavelet transformation and encoding to produce compressed point cloud. See FIGS. 2F-2I. In essence, the steps 2006 break channel data into high frequency and low frequency coefficients using a lifting scheme. The pipeline stages of the pipelined wavelet transformation performs bookkeeping to ensure that each set of selected records chosen for processing seamlessly fit together so as to avoid visual artifacts associated with conventional signal processing techniques.

From terminal E (FIG. 2F), the method proceeds to block 2042 where the method receives a channel. Proceeding to another continuation terminal ("terminal E1"), the method further proceeds to block 2044 where the method presents the channel to a pipeline stage of a wavelet transform. From here, in parallel, the path of execution proceeds to two continuation terminals ("terminal E2" and "terminal E3"). From terminal E2 (FIG. 2F), the method proceeds to block 2046 where the pipeline stage produces high frequency sub-band coefficients. In one embodiment where the data is not floating point, the high frequency sub-band coefficients are produced when the pipeline stage splits the channel into odd coefficients and even coefficients, a prediction function is executed on the even coefficients and the predicted result is subtracted from the odd coefficients to produce the high frequency sub-band coefficients. In embodiments where the data is floating point, the prediction function is either disabled or produces zeroes. Next, at block 2048, the high frequency sub-band coefficients are presented to an encoder. The method then continues to another continuation terminal ("terminal E4").

From terminal E3 (FIG. 2G), the method proceeds to block 2050 where the pipeline stage produces low frequency sub-band coefficients. Next, at decision block 2052, a test is performed to determine whether there is another pipeline stage. If the answer to the test at decision block 2052 is No, the method proceeds to block 2054 where low frequency sub-band coefficients are presented to an encoder. In the one embodiment where the data is not floating point, the low frequency sub-band coefficients are produced when the pipeline stage splits the channel into odd coefficients and even coefficients, a prediction function is executed on the even coefficients, the predicted result is subtracted from the odd coefficients, and such a subtraction is input into an updated function, which results are added to the even coefficients to produce low frequency sub-band coefficients. In embodiments where the data is floating point, the update function is either disabled or produces zeroes. The method than proceeds to terminal E4. Otherwise, if the answer to the test at decision block 2052 is Yes, the method proceeds to block 2056 where the method prepares the low frequency sub-band coefficients for input as if they were data in a channel. The method then proceeds to terminal E1 and skips back to block 2044 where the above identified processing steps are repeated.

From terminal E4 (FIG. 2H), the method proceeds to decision block 2058 where a test is performed to determine whether the data is floating point data. If the answer is Yes to the test at decision block 2058, the method executes a compression algorithm. See block 2060. Next, the method writes the result to a compressed data cloud file. See block 2061. The method then continues to another continuation terminal ("Terminal E6"). If the answer to the test at decision block 2058 is No, the method progresses to block 2062. At block 2062, the method receives the sub-band coefficients and begins bit-plane encoding process by extracting the sign from the magnitude of each coefficient. (Any suitable entropy conserving compression may be used and it need not be the bit-plane encoding process, which is provided here as an illustrative example.) The method then proceeds to another continuation terminal ("terminal E5").

From terminal E5 (FIG. 2I), the method proceeds to block 2064, taking the magnitude of all coefficients, the method builds bit-planes from them. Taking each bit-plane and associated sign information, the method executes an encoding process. See block 2068. At block 2070, the method extracts a context stream, a bit stream, and plane layout from the encoding process. At block 2072, the method takes the content stream and the bit stream and presents them to an MQ encoder. The method then proceeds to block 2078 where after taking the output of the MQ encoder and the plane layout, the method performs a serialization and writes the result of the serialization to a compressed point cloud. Next, the method proceeds to Terminal E6 (FIG. 2I) and further proceeds to decision block 2080 where a test is performed to determine whether there are more records in the point cloud file. If the answer to the test at decision block 2080 is No, the method proceeds to terminal F and terminates execution. Otherwise, if the answer to the test at decision block 2080 is Yes, the method proceeds to terminal A3 (FIG. 2C) and skips back to block 2024 where the above identified processing steps are repeated.

Figure 3A:
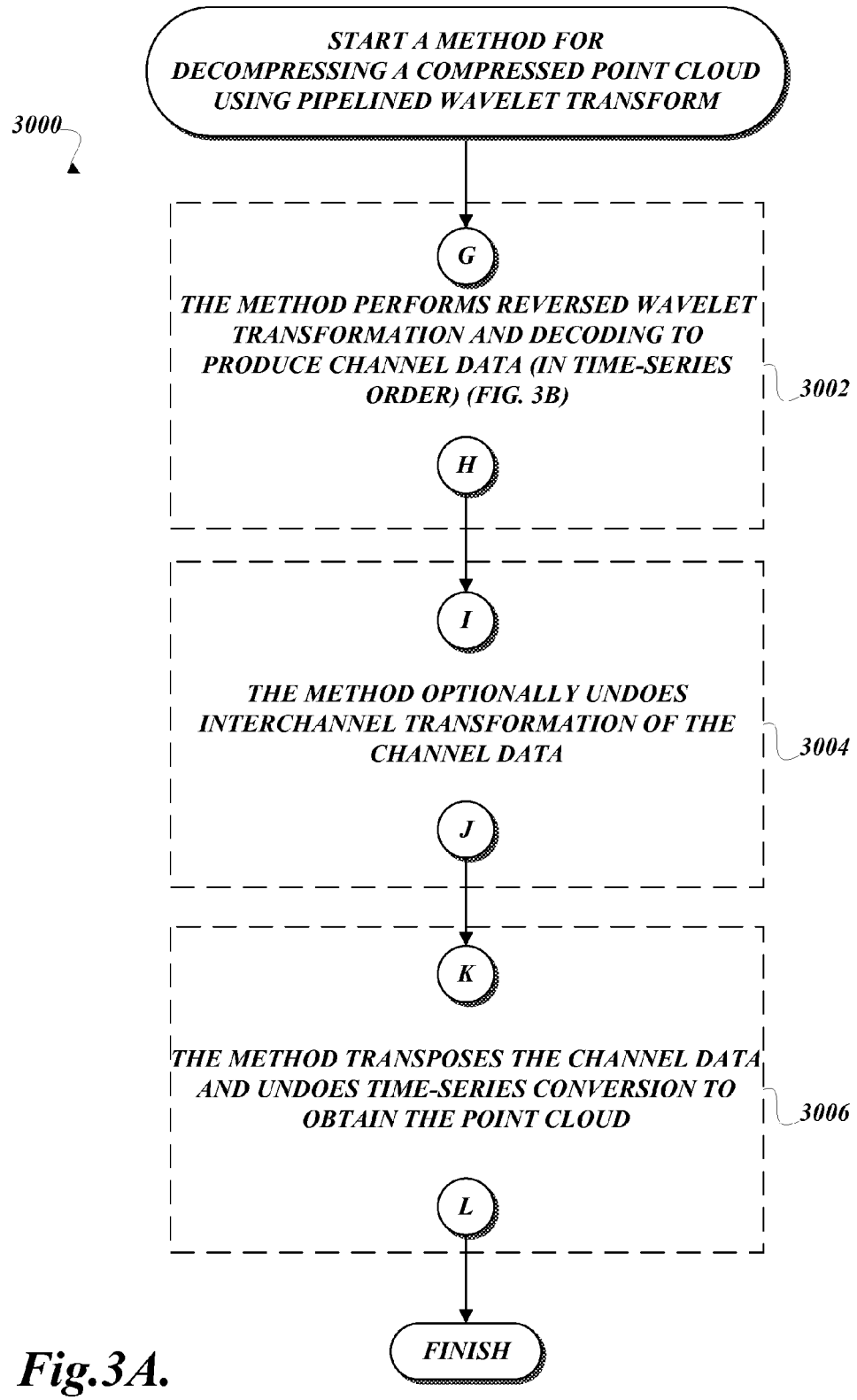
FIGS. 3A-3B are process diagrams illustrating a method for decompressing so as to recover a point cloud in accordance with one embodiment of the present subject matter.
Figure 3B:
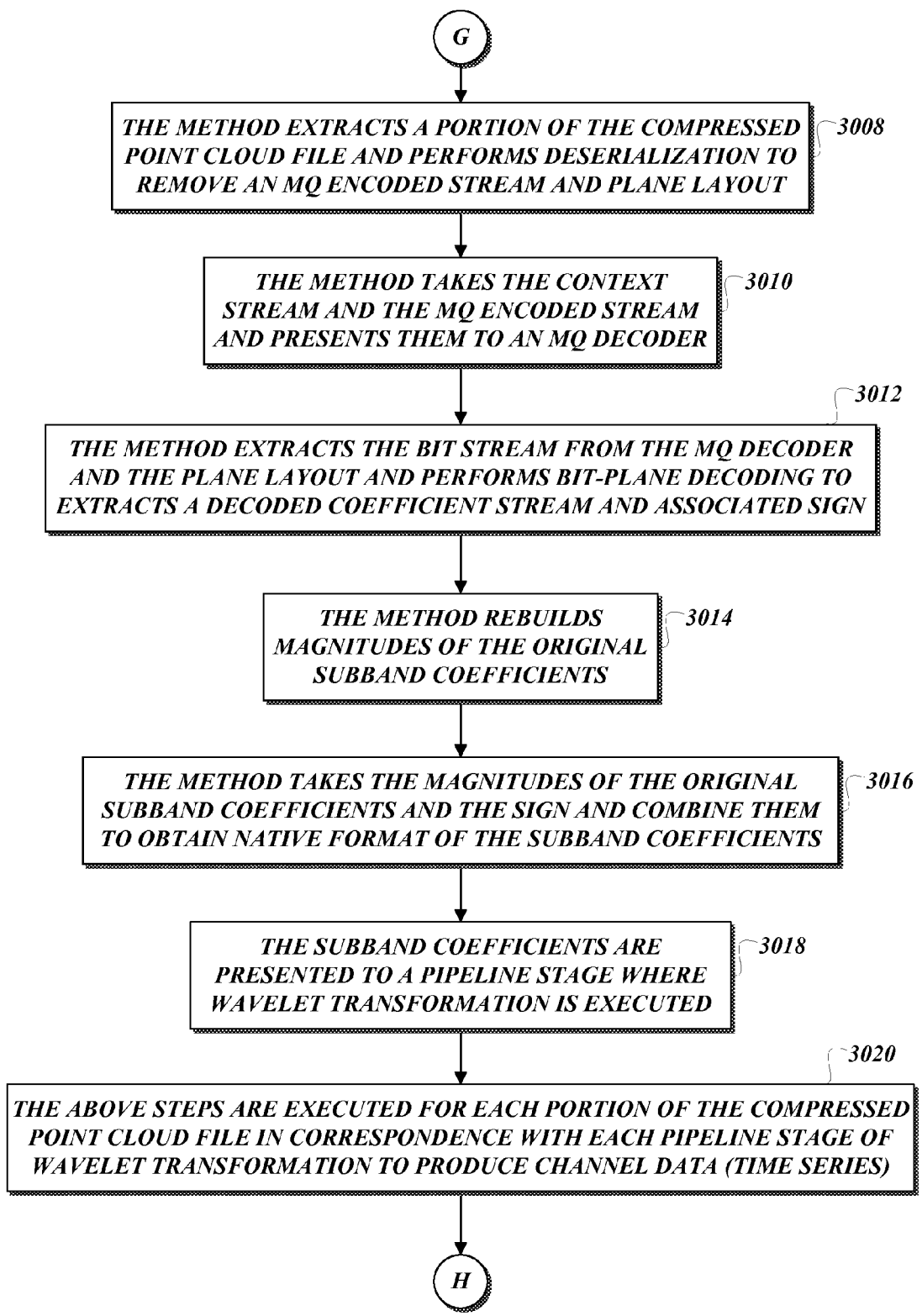

FIGS. 3A-3B illustrate a method 3000 for decompressing a compressed point cloud produced by a pipelined wavelet transformation. In essence, the method 3000 executes the steps of FIGS. 2A-2I backwards. The method 3000 typically requires less memory because it lacks the need to gather information regarding which bit-planes are to be thrown out for compression. From a start block, the method 3000 proceeds to a set of method steps 3002, defined between a continuation terminal ("terminal G") and an exit terminal ("terminal H"). The set of method steps 3002 describes the execution of reversed wavelet transformation and decoding to produce channel data (in time series order). See FIG. 3B.

From terminal G (FIG. 3B), the method proceeds to block 3008 where the method extracts a portion of the compressed point cloud file and performs deserialization to remove an MQ-encoded stream and plane layout. (Of course, where the data was determined to be floating point, there would be no need to perform any MQ-decoded process.) At block 3010, the method takes the context stream and the MQ-encoded stream, and presents to an MQ decoder. The method then extracts the bit stream from the MQ decoder and the plane layout, and performs bit plane decoding to extract a decoded coefficient stream and associated sign. See block 3012. (Any suitable entropy conserving decompression may be used and it need not be the bit-plane decoding process, which is provided here as an illustrative example.) At block 3014, the method rebuilds magnitudes of the original sub-band coefficients. The method then takes the magnitudes of the original sub-band coefficients and the sign, and combines them to obtain the native format of the sub-band coefficients. See block 3016. At block 3018, the sub-band coefficients are presented to a pipeline stage where wavelet transformation is executed. (Again, where the data was determined to be floating point, there would be no need to execute any reversed update functions or predict functions.) The above steps are repeated for each portion of the compressed point cloud file in correspondence with each pipeline stage of wavelet transformation to produce channel data (in time series order). The method then enters terminal H.

From terminal H (FIG. 3A), the method 3000 proceeds to a set of method steps 3004, defined between a continuation terminal ("terminal I") and an exit terminal ("terminal J"). The set of method steps 3004 describes the optional undo of interchannel transformation of the channel data. In essence, the steps 3004 are the reverse of the steps performed between terminals C, D. From terminal J (FIG. 3A), the method proceeds to a set of method steps 3006, defined between a continuation terminal ("terminal K") and an exit terminal ("terminal L"). The set of method steps 3006 describes transposing the channel data and the undoing of the time-series conversion to obtain the point cloud. From terminal L, the method terminates execution.

While illustrative embodiments have been illustrated and described, it will be appreciated that various changes can be made therein without departing from the spirit and scope of the invention.

The embodiments of the invention in which an exclusive property or privilege is claimed are defined as follows:

1. A system for compressing a point cloud, comprising:
   a time series converter being executed on a computer with a processor configured to receive vectors of the point cloud, and further configured to sort the vectors of the point cloud in accordance with ordinal references that are indicative of the order in which the data of the vectors were collected; and
   a pipelined wavelet transformer being executed on the computer or another computer with another processor comprising multiple pipeline stages all configured to receive the point cloud from the time series converter to produce coefficients that facilitate compression to produce a compressed point cloud.

2. The system of claim 1, further comprising an interchannel transformer configured to detect a relationship between one channel and another channel, and further configured to perform a transformation so as to allow one channel to be a primary channel that undergoes lesser compression and another channel to be an auxiliary channel that undergoes greater compression.

3. The system of claim 1, further comprising a reversed wavelet transformer configured to decompress the compressed point cloud.

4. The system of claim 2, further comprising a reversed interchannel transformer configured to reverse a transformation performed by the interchannel transformer.

5. The system of claim 1, further comprising a reversed time series converter configured to sort the vectors of the point cloud in accordance with an order in which the data of the vectors were originally presented in the point cloud.

6. A method for compressing a point cloud, comprising:
   converting vectors of the point cloud in a computer in accordance with ordinal references that are indicative of the order in which the data of the vectors were collected; and
   compressing using wavelet transformation in multiple pipeline stages all configured to receive the point cloud from the act of converting to produce coefficients that facilitate compression to produce a compressed point cloud.

7. The method of claim 6, further comprising performing an interchannel transformation by detecting a relationship between one channel and another channel, and specifying one channel to be a primary channel that undergoes lesser compression and another channel to be an auxiliary channel that undergoes greater compression.

8. The method of claim 6, further comprising decompressing the compressed point cloud.

9. The method of claim 7, further comprising reversing the interchannel transformation.

10. The method of claim 6, further comprising reversing the conversion of vectors of the point cloud in accordance with ordinal references that are indicative of the order in which the data of the vectors were collected.

11. A tangible computer-readable medium, which is non-transitory, having computer-executable instructions stored thereon for implementing a method for compressing a point cloud, comprising:
    converting vectors of the point cloud in accordance with ordinal references that are indicative of the order in which the data of the vectors were collected; and
    compressing using wavelet transformation in multiple pipeline stages all configured to receive the point cloud from the act of converting to produce coefficients that facilitate compression to produce a compressed point cloud.

12. The computer-readable medium of claim 11, further comprising performing an interchannel transformation by detecting a relationship between one channel and another channel, and specifying one channel to be a primary channel that undergoes lesser compression and another channel to be an auxiliary channel that undergoes greater compression.

13. The computer-readable medium of claim 11, further comprising decompressing the compressed point cloud.

14. The computer-readable medium of claim 12, further comprising reversing the interchannel transformation.

15. The computer-readable medium of claim 11, further comprising reversing the conversion of vectors of the point cloud in accordance with ordinal references that are indicative of the order in which the data of the vectors were collected.

* * * * *